COMPONENT LEAD FORMING APPARATUS

Filed Oct. 8, 1957 4 Sheets-Sheet 1

INVENTORS
D. P. RYDER
D. E. WILSON
BY R. P. Miller
ATTORNEY

Nov. 28, 1961 D. P. RYDER ET AL 3,010,492

COMPONENT LEAD FORMING APPARATUS

Filed Oct. 8, 1957 4 Sheets-Sheet 2

INVENTORS
D. P. RYDER
D. E. WILSON
BY R. P. Miller
ATTORNEY

COMPONENT LEAD FORMING APPARATUS
Filed Oct. 8, 1957 4 Sheets-Sheet 3
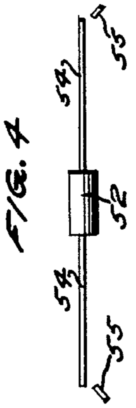
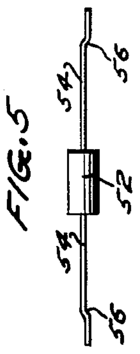
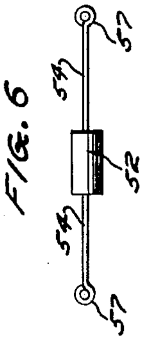
FIG. 4 FIG. 5 FIG. 6
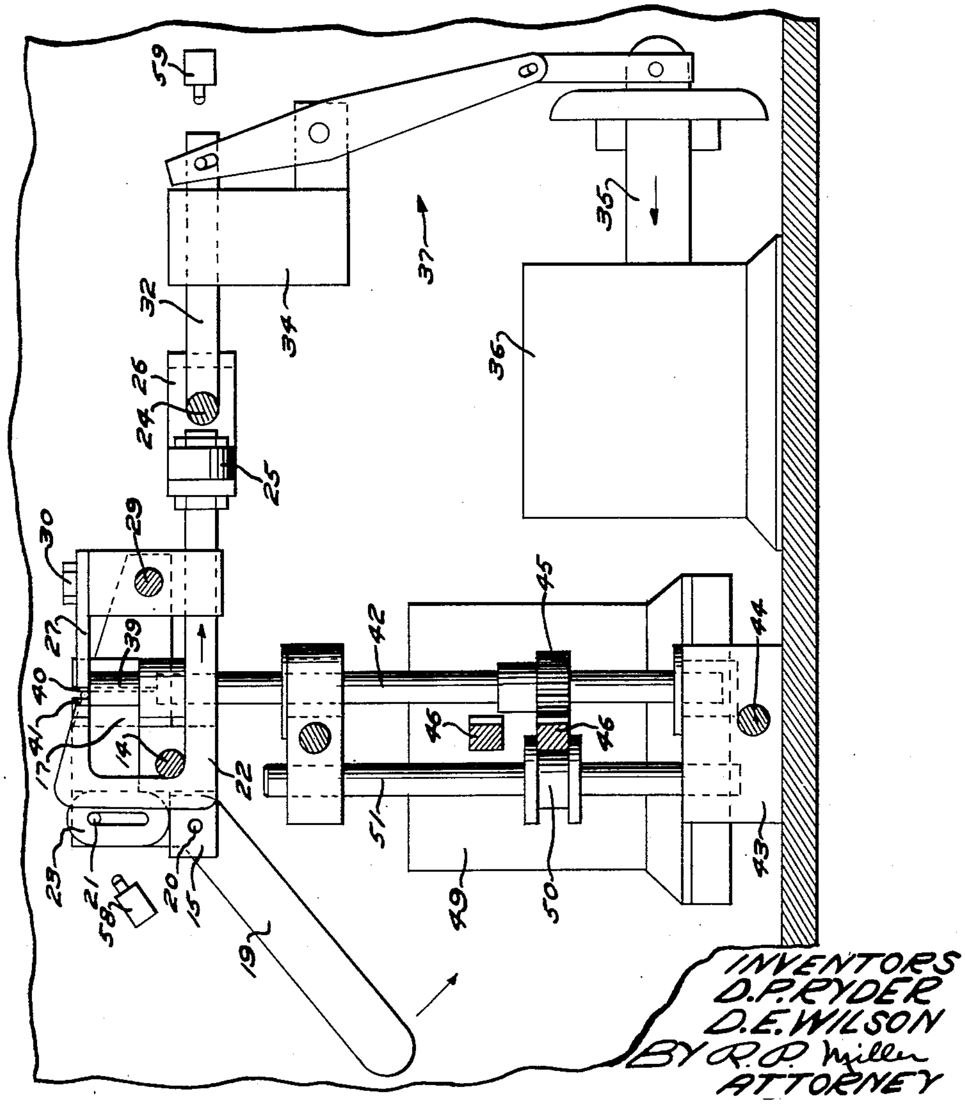
FIG. 3
INVENTORS
D.P.RYDER
D.E.WILSON
BY R.P. Miller
ATTORNEY Nov. 28, 1961 D. P. RYDER ET AL 3,010,492
COMPONENT LEAD FORMING APPARATUS
Filed Oct. 8, 1957 4 Sheets-Sheet 4

INVENTORS
D. P. RYDER
D. E. WILSON
BY R. P. Miller
ATTORNEY

United States Patent Office 3,010,492

Patented Nov. 28, 1961

3,010,492

COMPONENT LEAD FORMING APPARATUS

Donald P. Ryder and Delbert E. Wilson, Winston-Salem, N.C., assignors to Western Electric Company, Incorporated, New York, N.Y., a corporation of New York Filed Oct. 8, 1957, Ser. No. 688,910

1 Claim. (Cl. 140—104)

This invention relates to wire forming apparatus and more particularly to an apparatus for forming eyelets on the terminal extremities of electrical component leads.

In the past, it has been customary to manually form the ends of component leads into eyelet shapes by the use of a pair of long-nosed pliers or a similar instrument. It is obvious, of course, that this is a time consuming process and hence one to be avoided whenever the number of electrical components involved is large. It would be highly desirable to eliminate this operation by means of an apparatus which will rapidly and uniformly perform these tedious manual operations.

It is therefore a primary object of this invention to provide an apparatus which will rapidly and uniformly form eyelets in the terminal extremities of wires.

It is another object of this invention to provide an apparatus which will cut component leads to length and then bend the leads about fixed bending posts to form eyelets therein.

It is a further object of this invention to provide an apparatus which will grip and hold component leads during the forming operation.

It is still another object of this invention to provide an apparatus having rotatable heads for forming eyelets in the extremities of electrical component leads.

With these and other objects in view, the present invention contemplates a wire forming apparatus including a support for positioning an electrical component relative to a pair of forming heads. Two pairs of cutting blades are provided for trimming the excess wire from the extremities of the component leads. Two pairs of clamping jaws are positioned intermediate the component support and the forming heads for gripping the remaining portions of the component leads upon completion of the trimming operation. A pair of rack and pinion drives are provided for rotating forming heads to form eyelets in the extremities of the component leads upon completion of the clamping operation.

Other objects, advantages and novel features of the invention will become apparent upon consideration of the following detailed description in conjunction with the accompanying drawings wherein:

FIG. 3 is a sectional view taken along the line 3—3 of FIG. 1 illustrating a solenoid operated linkage mechanism utilized to actuate the wire clamping jaws;

FIGS. 4, 5 and 6 are three views of an electrical component illustrating the various steps of the forming operation;

Figure 1:
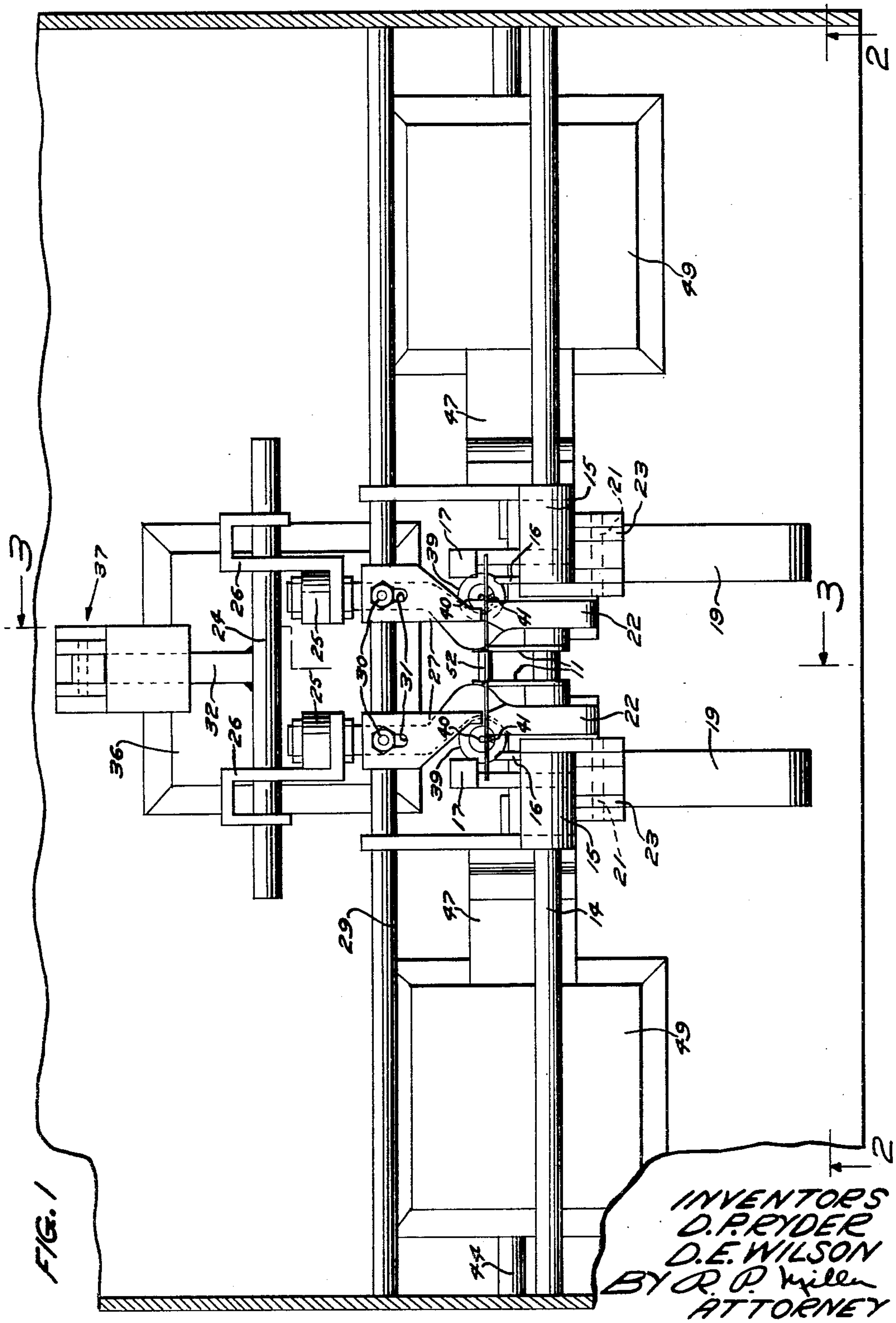
FIG. 1 is a top plan view of an apparatus embodying the principal features of the invention and illustrating a component positioned relative to the clamping jaws, trimming blades and the forming heads.
Figure 10:
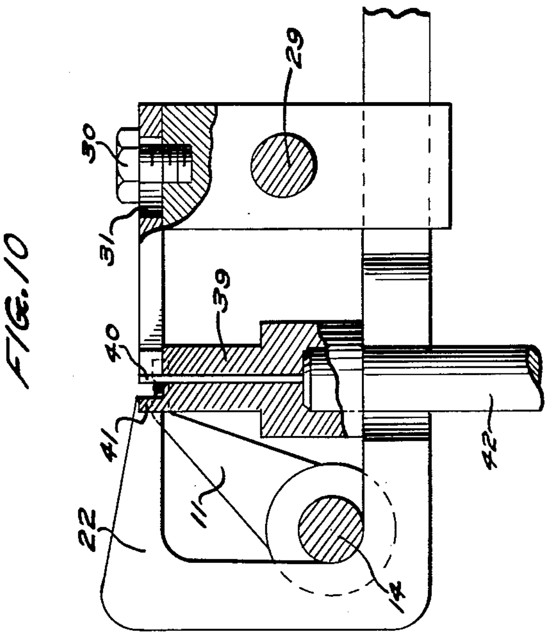
Figure 7:
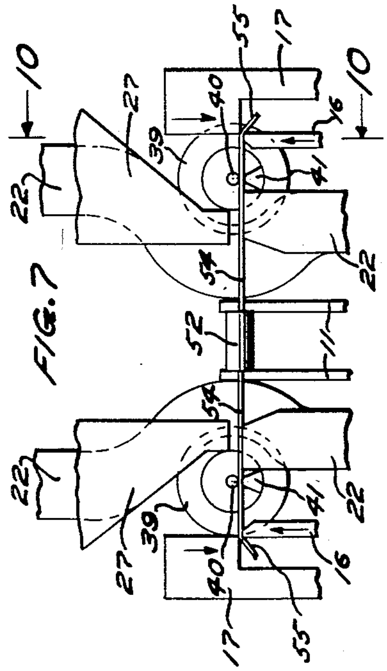
Figure 8:
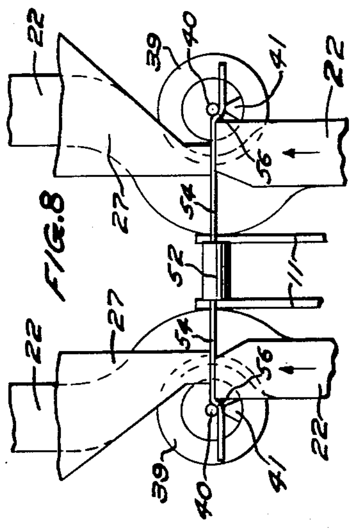
Figure 9:
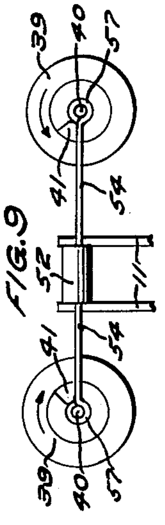

FIGS. 7, 8 and 9 are enlarged, fragmentary, top plan views of the apparatus shown in FIG. 1 and illustrate the operations performed by the trimming blades, the clamping jaws and the rotatable forming heads, respectively; and FIG. 10 is a view, partially in section, taken along the line 10—10 of FIG. 7 and illustrating the relationship between the component support, the wire clamping jaws and the forming heads.

Figure 2:
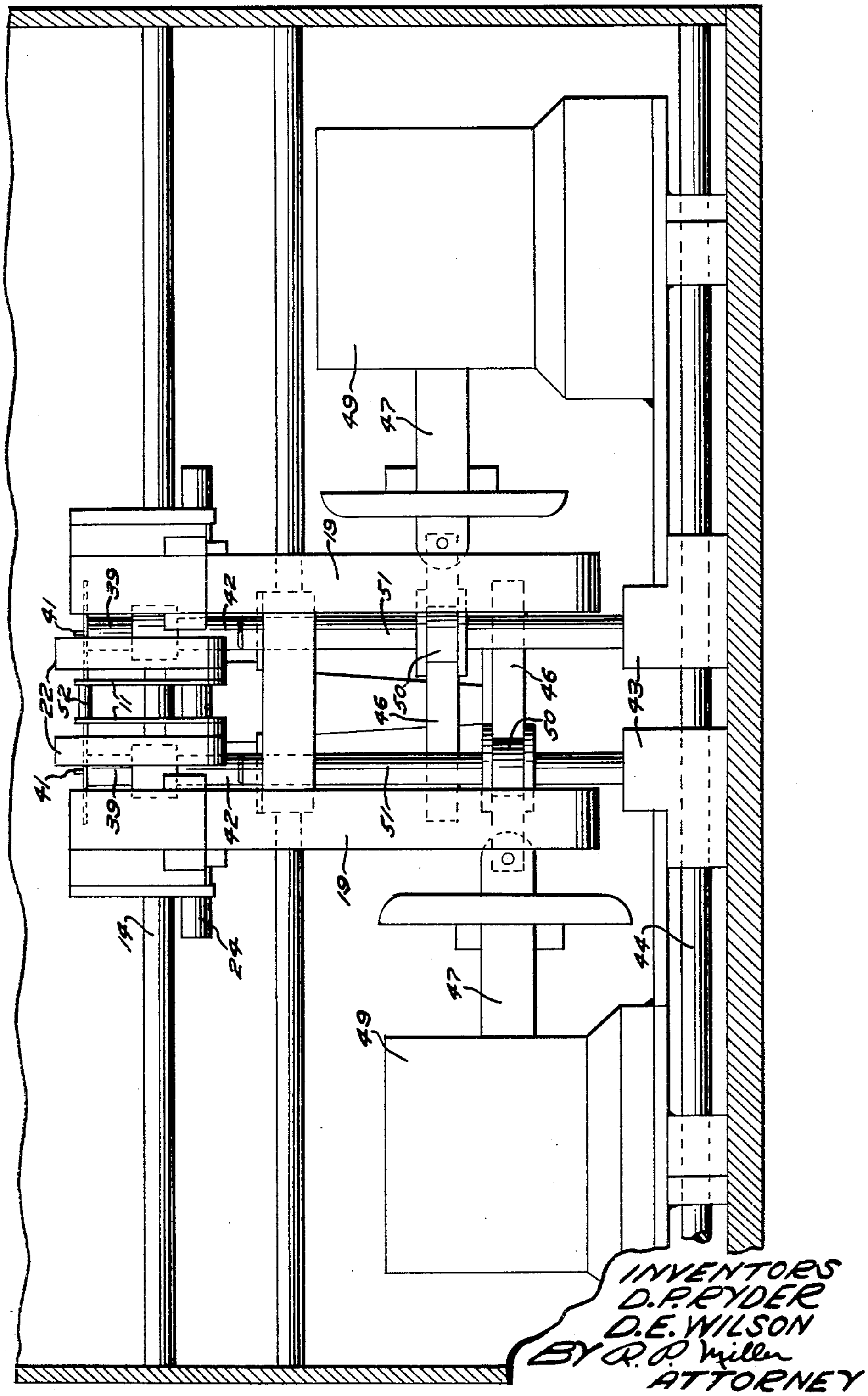
FIG. 2 is a side elevation view of an apparatus shown in FIG. 1 illustrating the drives utilized for rotating the forming heads to form the eyelets.

Attention now is directed to the drawings wherein like numerals of reference designate like parts throughout the several views, and in particular to FIGS. 1, 2 and 3 wherein is disclosed a pair of component supports 11 which are adjustably secured to a rod 14 in any suitable manner. A pair of trimmer blade supports 15 are adjustably secured to the rod 14 and mount fixed trimmer blades 16. The blocks 15 slidably support movable trimmer blades 17. A pair of handles 19 are provided to effect relative movement between the pairs of trimmer blades 16 and 17. The handles 19 are pivotally mounted on the blocks 15 by means of pivot pins 20 and are connected to the slidable blades 17 by means of pins 21 through slotted yokes 23.

A pair of U-shaped, movable, wire clamping jaws 22 are positioned between the supports 11 and the blocks 15 and are connected to a shaft 24 by means of resilient pads 25 and brackets 26. The U-shaped ends of the jaws 22 surround the rod 14, but are not connected thereto. A pair of fixed wire clamping jaws 27 are adjustably secured to a rod 29 in positions opposite the movable jaws 22. As best illustrated in FIG. 10, the jaws 27 may be adjusted relative to the support 11 by means of clamping screws 30 positioned within slots 31. A rod 32 connected to the shaft 24 is slidably positioned within a fixed bearing block 34 and is connected to an armature 35 of a solenoid 36 by means of a linkage designated generally by the reference numeral 37.

A pair of forming heads 39 are positioned beneath the pairs of jaws 22 and 27 and are provided with axial bending pins 40 and eccentric bending projections 41 on the upper extremities thereof. The forming heads 39 are secured to shafts 42 which are rotatably mounted in bearing blocks 43. The blocks 43 are mounted for axial movement along a rod 44 and may be clamped in various positions therealong by suitable means (not shown). The shafts 42 carry pinions 45 keyed thereto which are in mesh with racks 46 carried by armatures 47 of solenoids 49. The racks 46 are supported by back-up rollers 50 which are rotatable on shafts 51.

*Operation*

In order that a better understanding of the invention may be had, its mode of operation will now be described with particular reference to FIGS. 4–9, inclusive.

A component 52 having leads 54 thereon is placed in the apparatus with the leads 54 resting in arcuate notches formed in the supports 11. The handles 19 are then moved in the direction indicated by the arrow in FIG. 3 to cause the movable trimming blades 17 to move toward the fixed blades 16 to sever the excess portions 55 from the leads 54 as best illustrated in FIGS. 4 and 7. As the blades 17 reach the end of their stroke under the influence of the handles 19, a microswitch 58 is tripped thereby to energize a solenoid 36. Energization of the solenoid 36 retracts the armature 35 and through the interconnecting linkage causes the movable clamping jaws 22 to move in the direction indicated by the arrows in FIGS. 3 and 8 to clamp the leads 54 between the jaws 22 and 27. As the jaws 22 clamp the leads 54 against the jaws 27, initial bends 56 will be formed in the leads 54 due to the relative positions of the jaws 27, the bending pins 40 and the bending projections 41. A second microswitch 59 is tripped as the jaws 22 complete their movement to energize the solenoids 49 and thus cause retraction of the armatures 47 and hence the racks 46 which are connected thereto. Movement of the racks 46 causes rotation of the shafts 42 through the pinions 45. The shafts 42 in turn rotate the forming heads 39 in the directions indicated by the arrows in FIG. 9. As the forming heads 39 rotate, the extremities of the leads 54 are bent about the pins 40, due to the wiping action of the bending projections 41, to form the eyelets 57 as illustrated in FIGS. 6 and 9. The solenoids may then be deenergized and the completed component removed from the apparatus.

The supports 11, supporting blocks 15, fixed clamping jaws 27 and brackets 26 are all made axially adjustable along the rods 14 and 29 and shafts 24 to permit the accommodation of electrical components having bodies of different lengths. The clamping jaws 27 are made adjustable transversely of the rod 29 and the forming heads 39 are made removable to permit the formation of eyelets having various diameters. Thus it can be seen that a simple apparatus has been provided which will quickly and rapidly form eyelets of various diameters in the extremities of the leads of electrical components having differing lengths.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

An apparatus for forming an eyelet in a single plane on the extremity of a wire, comprising means for supporting the wire, trimming means, rotatably mounted means for actuating said trimming means for severing excess material from the end of the wire, a pair of gripping jaws positioned intermediate said supporting means and said trimming means, means to actuate said gripping jaws, a first switch in the path of said rotatably mounted means and making contact therewith upon the rotation thereof, a first solenoid energized by said first switch adapted to operate actuating means for closing said gripping jaws, a second switch in the path of said gripping jaw actuating means and making contact therewith upon operation thereof, a second solenoid, a forming head having an axial pin and an eccentric pin projecting therefrom for receiving the wire therebetween for forming an eyelet in a single plane in the extremity of the wire, said second switch energizing said second solenoid to rotate said forming head until a closed eyelet in a single plane is formed.

References Cited in the file of this patent

UNITED STATES PATENTS

| | | |
|---|---|---|
| 1,212,437 | Bates | Jan. 16, 1917 |
| 1,583,321 | Smith | May 4, 1926 |
| 1,626,652 | Whitmore | May 3, 1927 |
| 2,653,632 | Corbett | Sept. 29, 1953 |
| 2,830,625 | Gasper et al. | Apr. 15, 1958 |